(12) United States Patent
Kimball et al.

(10) Patent No.: US 9,287,435 B2
(45) Date of Patent: Mar. 15, 2016

(54) METHOD OF MAKING PHOTOVOLTAIC DEVICES INCORPORATING IMPROVED PNICTIDE SEMICONDUCTOR FILMS

(71) Applicants: DOW GLOBAL TECHNOLOGIES LLC, Midland, MI (US); CALIFORNIA INSTITUTE OF TECHNOLOGY, Pasadena, CA (US)

(72) Inventors: Gregory M. Kimball, Campbell, CA (US); Harry A. Atwater, South Pasadena, CA (US); Nathan S. Lewis, La Canada, CA (US); Jeffrey P. Bosco, Pasadena, CA (US); Rebekah K. Feist, Midland, MI (US)

(73) Assignees: Dow Global Technologies LLC, Midland, MI (US); California Institute of Technology, Pasadena, CA (US)

(*) Notice: Subject to any disclaimer, the term of this patent is extended or adjusted under 35 U.S.C. 154(b) by 0 days.

(21) Appl. No.: 14/373,598

(22) PCT Filed: Jan. 30, 2013

(86) PCT No.: PCT/US2013/023824
§ 371 (c)(1),
(2) Date: Jul. 21, 2014

(87) PCT Pub. No.: WO2013/116323
PCT Pub. Date: Aug. 8, 2013

(65) Prior Publication Data
US 2015/0011042 A1 Jan. 8, 2015

Related U.S. Application Data

(60) Provisional application No. 61/592,946, filed on Jan. 31, 2012.

(51) Int. Cl.
*H01L 31/00* (2006.01)
*H01L 31/18* (2006.01)
(Continued)

(52) U.S. Cl.
CPC ........ *H01L 31/18* (2013.01); *H01L 31/022466* (2013.01); *H01L 31/032* (2013.01); *H01L 31/075* (2013.01); *H01L 31/20* (2013.01); *Y02E 10/548* (2013.01)

(58) Field of Classification Search
None
See application file for complete search history.

(56) References Cited

U.S. PATENT DOCUMENTS

| 4,325,986 A | 4/1982 | Baron et al. |
| 4,342,879 A | 8/1982 | Catalano et al. |

(Continued)

FOREIGN PATENT DOCUMENTS

JP   61-201623   9/1986

OTHER PUBLICATIONS

Kimball et al., "Mg Doping and Alloying in Zn3P2 Heterojunction Solar Cells" 35th IEEE Photovoltaic Specialists Conference (PVSC), pp. 1039-1043, Jun. 2010.

(Continued)

*Primary Examiner* — Charles Garber
*Assistant Examiner* — Evren Seven
(74) *Attorney, Agent, or Firm* — Kagan Binder, PLLC

(57) ABSTRACT

The present invention uses a treatment that involves an etching treatment that forms a pnictogen-rich region on the surface of a pnictide semiconductor film The region is very thin in many modes of practice, often being on the order of only 2 to 3 nm thick in many embodiments. Previous investigators have left the region in place without appreciating the fact of its presence and/or that its presence, if known, can compromise electronic performance of resultant devices. The present invention appreciates that the formation and removal of the region advantageously renders the pnictide film surface highly smooth with reduced electronic defects. The surface is well-prepared for further device fabrication.

15 Claims, 4 Drawing Sheets

(51) Int. Cl.
   *H01L 31/0224* (2006.01)
   *H01L 31/032* (2006.01)
   *H01L 31/075* (2012.01)
   *H01L 31/20* (2006.01)
   *H01L 21/00* (2006.01)

(56) References Cited

U.S. PATENT DOCUMENTS

| | | |
|---|---|---|
| 4,477,688 A | 10/1984 | Barnett et al. |
| 2006/0112985 A1 | 6/2006 | Hantschel et al. |
| 2011/0309477 A1 | 12/2011 | Kimball et al. |
| 2013/0323877 A1* | 12/2013 | Kimball et al. ............ 438/93 |
| 2014/0093996 A1* | 4/2014 | Ye et al. ............ 438/93 |

OTHER PUBLICATIONS

M. Bushan, "Mg Diffused Zinc Phosphide N/P Junctions" Journal of Applied Physics, vol. 53, No. 1, pp. 514-519, 1982.
E.A. Fagen, "Optical properties of $Zn_3P_2$" J. Appl. Phys, vol. 50, No. 10, 6505-6515 (1979).
Wyeth et al, ":Spectral response measurements of minority carrier diffusion length in Zn3P2" J. Appl. Phys., vol. 50, No. 3, 1402-1407 (1979).
Catalano et al. "Defect Dominated Conductivity in $Zn_3P_2$." J. Phys. Chem. Solids, vol. 41, pp. 635-640 (1980).
Wang et al., "Transport mechanisms for Mg/Zn3P2 junctions" J. Appl. Phys., vol. 53, No. 12, 8874-8879 (1982).
Bhushan et al., "Photoelectrochemical Investigation of $Zn_3P_2$" J. of Electrochemical Society, vol. 133, No. 3, pp. 536-539 (1986).
Bhushan et al, "Polycrystalline Zn3P2 Schottky barrier solar cells" Appl. Phys. Lett. 38 (1), 39-41, (1981).
Suda et al., "Ntype zinc phosphide grown by molecular beam epitaxy" Appl. Phys. Lett., vol. 69, No. 16, 2426-248, (1996).
Schlesinger "The Thermodynamic Properties of Phosphorus and Solid Binary Phosphides" Chem. Rev., vol. 102, No. 11, pp. 4267-4301 (2002).
Johnson et al., "Phosphorus cracking efficiency and flux transients from a valved effusion cell" J. Appl. Phys. vol. 78, No. 3, pp. 1164-1668 (1995).
Kimball et al., Photoluminescence-based measurements of the energy gap and diffusion length of Zn3P2 Appl. Phys. Lett., vol. 95, pp. 112103-1-112103-3 (2009).
Catalano "The growth of large Zn3P2 Crystals by vapor transport" Journal of Crystal Growth, vol. 49, pp. 681-686 (1980).
Wang et al., "Single crystal growth of Zn3P2" Journal of Crystal Growth, vol. 55, pp. 268-272 (1981).
Kimball et al., "Synthesis and surface chemistry Zn3P2" 2008 33$^{rd}$ IEEE Photovolatic Specialists Conference, pp. 1-6, (2008).
Huppert et al. "Summary Abstract: Measurements of surface recombination velocity of CdS surfaces and Au interfaces" J. Vac Sci. Technol. A 2 (2), p. 532-533 (1984).
Nesbitt et al., "Minimum XPS core-level line widths of insulators, including silicate minerals" American Mineralogist, vol. 89, pp. 878-882 (2004).
Tougaard et al. "Influence of elastic and inelastic scattering on energy spectra of electrons emitted from solids" Physical Review B, vol. 25, No. 7, pp. 4452-4466 (1982).
Doniach et al., "Many-electron singularity in X-ray photoemission and X-ray line spectra from metals" J. Phys. C: Solid State Phys. vol. 3, pp. 285-291 (1970).
Gadzuk et al., "Excitation energy dependence of core-level x-ray-photoemission-spectra line shapes in metals" Physical Review B, vol. 12, No. 2, pp. 524-530 (1975).
Huffner et al., "Core-line asymmetries in the x-ray-photoemission spectra of metals" Physical Review B, vol. 11, No. 2, pp. 678-693 (1975).
Taniguchi et al., "Core-exciton inducted resonant photoemission in the covalent semiconductor black phosphorus" Solid State Communications, vol. 49, No. 9, pp. 867-870 (1984).

Terman "An Investigation of Surface States at a Silicon/Silicon Oxide Interface Employing Metal-Oxide—Silicon Diodes" Solid-State Electronics, vol. 5, pp. 285-299 (1962).
Misiewicz et al., "Lattice Modes of Zn3P2" Solid State Communications, vol. 66, No. 7, pp. 747-750 (1988).
Chang et al., "Surface characterization of InP using photoluminescence" J. Appl. Phys. vol. 61, No. 5, pp. 1995-2004 (1987).
Szatkowski et al., ":Electrical Properties of Mg—Zn3P2 Contacts" Phys. Stat. Sol. (a), vol. 106, No. 2, pp. 473-477 (1988).
Schmitt et al. "Formation of p+ (p–)n Junctions in InP and their dependence on substrate concentration, time and temperature" Journal of Crystal Growth, vol. 83, No. 2, pp. 261-264 (1987).
Kimball et al., "Passivation of Zn3P2 substrates by aqueous chemical etching and air oxidation" Journal of Applied Physics, vol. 112, No. 10, pp. 106101-106101-3, (2012).
Kakishita et al., "$Zn_3P_2$ photovoltaic film growth for $Zn_3P_2$/ZnSe soloar cell" Solar Energy Materials and Solar Cells, 35, pp. 333-340 (1994).
Bosco et al., "Energy-band alignment of II-VI/ZnPheterojunctions from x-ray photoemission spectroscopy" Journal of Applied Physics, vol. 113, No. 20, pp. 203705-203705 (2013).
Kitagawa et al., "Homoepitaxial Growth of Low-Resistivity-Al-Doped ZnS Single Crystal Films by Molecular Beam Epitaxy" Journal of Crystal Growth, vol. 95, pp. 509-511 (1989).
Yamaga et al. "Growth and Properties of Iodeine-Doped ZnS Films Grown by Low-Pressure MOCVD Using Ethyliodide as a Dopant Source" Journal of Crystal Growth, vol. 106, pp. 683-689 (1990).
Ohta et al., "Gallium-doping effects on the molecular bean epitaxial ZnS on GaAs" Journal of Materials Science Letters 7, pp. 506-508 (1988).
Olsen, et al., "Vacuum-evaporated conducting ZSnS films" Appl. Phys. Lett, vol. 34, No. 8, pp. 528-529 (1979).
Yasuda et al. "Low Resistivity A1-Doped ZnS Grown by MOVPE" Journal of Crystal Growth, vol. 77, pp. 485-489 (1986).
Kroemer "Band diagrams of heterostructures" E.F. Schubert, pp. 186-202 (1928).
Richason IV, "How to Remove a Sulfuric Acid Stain from a White Tub:" eHow, http://www.ehow.com/print/how_10043786_remove-sulfric-acid-stain-white-tub.html, p. 1 (2011).
Jones, "How to Remove Sulfuric Acid Stains from Stainless Steel" eHow, http://www.ehow.com/print/how_12123635_remove-sulfric-acid-stains-stainless-steel.html, p. 1 (2011).
Davis, "How to Clean Sulfuric Acid Stains" eHow, http://www.ehow.com/print/how_5720950_clean-sulfric-acid-stains.html, pp. 1-2 (2011).
Anderson, R. L., "Germanium—gallium arsenide heterojunction" IBM J. Res. Dev. vol. 4, No. 3, pp. 283-287 (1960).
E. Yablonovitch, et al., "Band bending, Fermi level pinning, and surface fixed charge on chemically prepared GaAs surfaces" Applied Physics Letters, 54 (6), pp. 555-557, 1989.
A. R. Denton et al., "Vegard's law" Phys. Rev. A, 43, 3161, 3 pp. (abstract only), Mar. 1991.
Suda et al., "Polycrystalline Zn3P2/Indium-Tin Oxide Solar Cells" JJ Apply Phys., vol. 22, No. 10, pp. L656-L658, 1983.
Feldberg et al., "Analysis of the decay of picosecond fluorescence in semiconductors: Criteria for the presumption of electroneutrality during the decay of an exponential electron-hole profile" Journal of Electroanalytical Chemistry, vol. 185, No. 2, pp. 209-288, 1985.
Sze et al., Physics of Semiconductor Devices, 3$^{rd}$. ed., Wiley-Interscience, pp. 674-679, 2006.
M.P. Seah et al., in Practice Surface Analysis, vol. 2$^{nd}$ ed. pp. 201-255, John Wiley & Sons, Chichester (1990).
Borisenko, V. E. And Ossicini, S., "What is What in the Nanoworld: A Handbook on Nanoscience and Nanotechnology". Germany: Wiley-VCH, pp. 513-522, 2004.
Davies, J. H., The Physics of Low-Dimensional Semiconductors UK: Cambridge University Press, (index and background, 23 pp.) 1997.

* cited by examiner

US 9,287,435 B2

METHOD OF MAKING PHOTOVOLTAIC DEVICES INCORPORATING IMPROVED PNICTIDE SEMICONDUCTOR FILMS

PRIORITY

This application claims priority to International Application No. PCT/US2013/023824, filed on Jan. 30, 2013, which in turn claims priority under 35 U.S.C. §119(e) to U.S. provisional application no. 61/592,946, titled "METHOD OF MAKING PHOTOVOLTAIC DEVICES INCORPORATING IMPROVED PNICTIDE SEMICONDUCTOR FILMS", filed Jan.31, 2012, wherein the disclosures of these application are incorporated herein by reference in their respective entireties for all purposes.

FIELD OF THE INVENTION

The present invention relates to methods of forming pnictide compositions suitable for use in microelectronic devices. More specifically, the present invention relates to methods in which a treatment involving at least two stages of etching and at least one oxidation are used in combination to not only clean the pnictide film surface, but also to render the film surface highly smooth with reduced electronic defects.

BACKGROUND OF THE INVENTION

Pnictide-based semiconductors include the Group IIB/VA semiconductors. Zinc phosphide ($Zn_3P_2$) is one kind of Group IIB/VA semiconductor. Zinc phosphide and similar pnictide-based semiconductor materials have significant potential as photoactive absorbers in thin film photovoltaic devices. Zinc phosphide, for example, has a reported direct band gap of 1.5 eV, high light absorbance in the visible region (e.g., greater than $10^4$ to $10^5$ $cm^{-1}$), and long minority carrier diffusion lengths (about 5 to about 10 µm). This would permit high current collection efficiency. Also, materials such as Zn and P are abundant and low cost.

Zinc phosphide is known to be either p-type or n-type. To date, it has been much easier to fabricate p-type zinc phosphide. Preparing n-type zinc phosphide, particularly using methodologies suitable for the industrial scale, remains challenging. This has confounded the fabrication of p-n homojunctions based upon zinc phosphide. Consequently, solar cells using zinc phosphide most commonly are constructed with Mg Schottky contacts or p/n heterojunctions. Exemplary photovoltaic devices include those incorporating Schottky contacts based upon p-$Zn_3P_2$/Mg and have exhibited about 5.9% efficiency for solar energy conversion. The efficiency of such diodes theoretically limits open circuit voltage to about 0.5 volts due to the about 0.8 eV barrier height obtained for junctions comprising $Zn_3P_2$ and metals such as Mg.

Improved efficiency and open circuit voltage would be expected, though, from p/n homojunction cells for which the junction is formed by contiguous regions of the same semiconductor material having p and n type conductivity, respectively. One exemplary advantage of a p/n homojunction would be a minimization of discontinuity in the energy band structure while the gross composition remains the same. Also, indices of refraction of the adjacent p/n material would match, minimizing reflection losses. Also, the coefficients of thermal expansion would be matched to minimize potential delamination risks.

Some investigators have suggested that a p/n homojunction can form in situ when a layer of p-type zinc phosphide is heated while in contact with magnesium. See, e.g., U.S. Pat. No. 4,342,879. Other investigators have prepared n-type zinc phosphide using molecular beam epitaxy. Other approaches to make n-type zinc phosphide also have been attempted. However, such approaches generally yield devices with poor photovoltaic behavior, if any, due at least in part to poor film quality, lack of control over film stoichiometry, and/or lack of control over formation of high quality p/n junctions.

Much research and development effort is focused upon improving the electronic performance of optoelectronic devices, particularly photovoltaic devices that incorporate pnictide-based semiconductors. One challenge involves the surface quality of the pnictide film as deposited. Often, the surface quality of such surfaces is inadequate for further device formation due to issues such as roughness, electronic defects, crystalline structure defects, contamination, and the like. Accordingly, one or more kinds of treatments are practiced in order to improve the surface quality. For example, mechanical polishing has the benefit of planarizing rough surfaces, but tends to damage surface crystal structures. Hydrogen plasma treatments clean impurities, but damage surface crystal structure. Conventional etching techniques using etching compositions such as $Br_2$ in methanol have been used to remove polishing and plasma damage, native oxides, and other impurities such as adventitious carbon, but then the resultant surface is of low electronic quality. Consequently, strategies for providing pnictide films with improved electronic characteristics are still needed.

SUMMARY OF THE INVENTION

The present invention provides methods of making photovoltaic devices incorporating improved pnictide semiconductor films. In particular, the principles of the present invention are used to improve the surface quality of pnictide films. Photovoltaic devices incorporating these films demonstrate improved electronic performance. As an overview, the present invention uses a treatment that involves an etching treatment that forms a pnictogen-rich region on the surface of the pnictide film. The region is very thin, often being on the order of only 2 to 3 nm thick in many embodiments. Previous investigators have left the region in place without appreciating that its presence can compromise electronic performance of resultant devices. The present invention appreciates that the formation and removal of the region advantageously renders the pnictide film surface highly smooth with reduced electronic defects. The surface is well-prepared for further device fabrication.

The resultant pnictide films can be incorporated into a wide range of microelectronic devices, including photovoltaic devices, antistatic films, antireflective stacks, electromagnetic shielding, heat-efficient electrochemical windows, electrochromic windows, electroluminescent lamps, liquid crystal and other flat panel displays, light emitting diodes, laser diodes, transparent membrane switches, touch screens, ultraviolet photoconductive detectors, thermoelectric devices, light polarization step indicators, infrared and other sensors, solid state lasers, as well as other optoelectronic and microelectronic devices.

In one aspect, the present invention relates to a method of making a photovoltaic device, comprising the steps of:
  a. providing a pnictide semiconductor film comprising at least one pnictide semiconductor, said film having a surface;
  b. treating the film, said treating comprising the steps of:
    i. contacting the film with a first etching composition in a manner effective to form a pnictogen-rich region on the surface of the film; and ii. removing at least a portion of the pnictogen-rich region.

DETAILED DESCRIPTION OF PRESENTLY PREFERRED EMBODIMENTS

Figure 1:
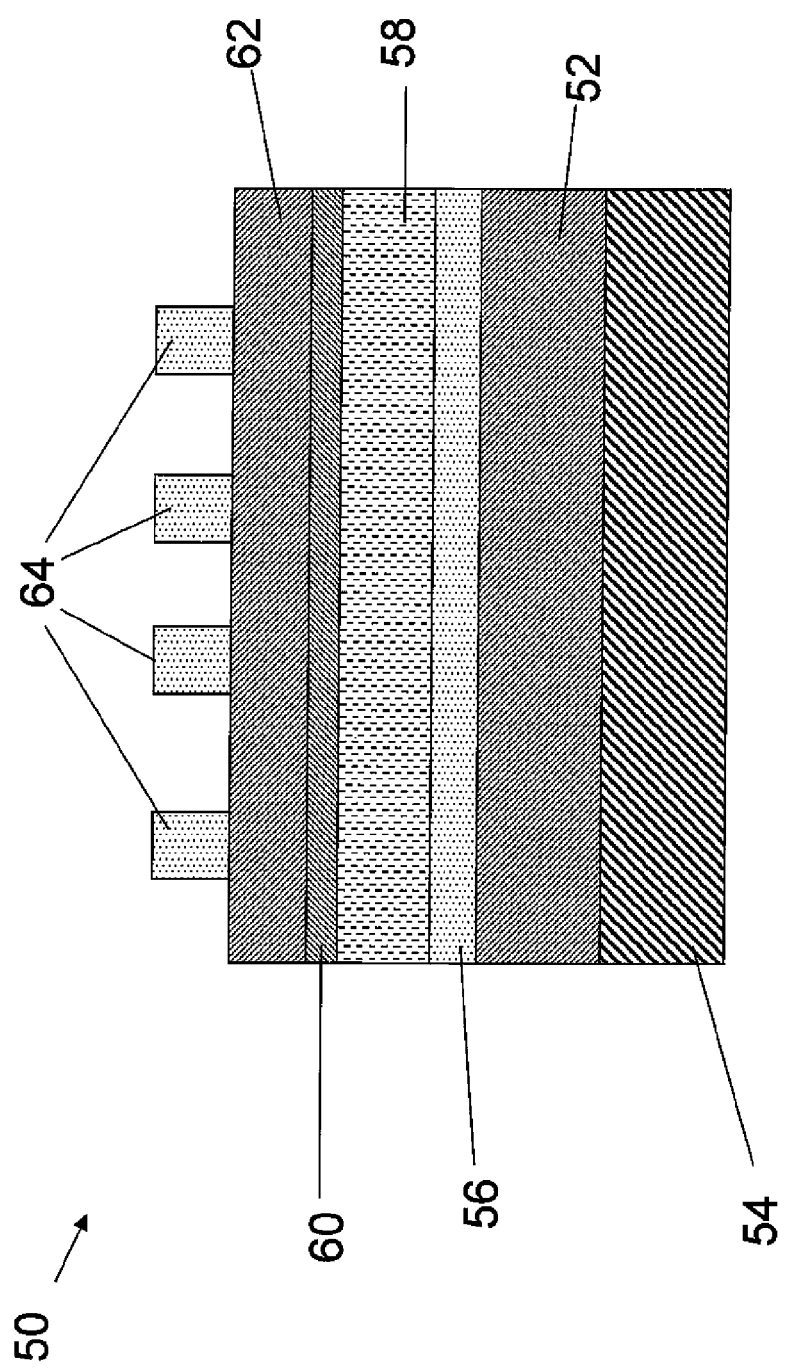
FIG. 1 is a schematic illustration in cross-section of an illustrative photovolatic device incorporating a pnictide semiconductor.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention. All patents, pending patent applications, published patent applications, and technical articles cited herein are incorporated herein by reference in their respective entireties for all purposes.

The principles of the present invention are used to improve the surface quality of pnictide films. Photovoltaic devices incorporating these films demonstrate improved electronic performance.

The term "pnictide" or "pnictide compound" refers to a molecule that includes at least one pnictogen and at least one element other than a pnictogen. The term "pnictogen" refers to any element from Group VA of the periodic table of elements. These also are referred to as Group VA or Group 15 elements. Pnictogens include nitrogen, phosphorus, arsenic, antimony, and bismuth. Phosphorus and arsenic are preferred. Phosphorus is most preferred.

In addition to the pnictogen(s), the other element(s) of a pnictide may be one or more metals, and/or nonmetals. In some embodiments, nonmetals may include one or more semiconductors. Examples of suitable metals and/or semiconductors include Si, the transition metals, Group IIB metals (Zn, Cd, Hg), metals included in the lanthanoid series, Al, F, Ga, In, Tl, Sn, Pb, H, combinations of these, and the like. In addition to the semiconductor materials noted above, other examples of such nonmetals include B, S, Se, Te, C, O, combinations of these, and the like. Examples of nonmetal pnictides include boron phosphide, boron nitride, boron arsenide, boron antimonide, combinations of these and the like. Pnictides that include both metal and nonmetal constituents in addition to one or more pnictogens are referred to herein as mixed pnictides. Examples of mixed pnictides include (a) at least one of Zn and/or Cd, (b) at least one of P, As, and/or Sb, and (c) at least one of Se and/or S, combinations of these, and the like.

Many embodiments of metal, non-metal, and mixed pnictides are photovoltaically active and/or display semiconductor characteristics. Examples of such photovoltaically active and/or semiconducting pnictides include phosphide, nitrides, antimonides, and/or arsenides of one or more of aluminum, boron, cadmium, gallium, indium, magnesium, germanium, tin, silicon, and/or zinc. Illustrative examples of such compounds include zinc phosphide, zinc antimonide, zinc arsenide, aluminum antimonide, aluminum arsenide, aluminum phosphide, boron antimonide, boron arsenide, boron phosphide, gallium antimonide, gallium arsenide, gallium phosphide, indium antimonide, indium arsenide, indium phosphide, aluminum gallium antimonide, aluminum gallium arsenide, aluminum gallium phosphide, aluminum indium antimonide, aluminum indium arsenide, aluminum indium phosphide, indium gallium antimonide, indium gallium arsenide, indium gallium phosphide, magnesium antimonide, magnesium arsenide, magnesium phosphide, cadmium antimonide, cadmium arsenide, cadmium phosphide, combinations of these and the like. Specific examples of these include $Zn_3P_2$; $ZnP_2$; $ZnAr_2$; $ZnSb_2$; $ZnP_4$;ZnP; combinations of these and the like.

Preferred embodiments of pnictide compositions comprise at least one Group IIB/VA semiconductor. A Group IIB/VA semiconductor generally includes (a) at least one Group IIB element and (b) at least one Group VA element. Examples of IIB elements include Zn and/or Cd. Zn is presently preferred. Examples of Group VA elements (also referred to as pnictogens) include one or more pnictogens. Phosphorous is presently preferred.

Exemplary embodiments of Group IIB/VA semiconductors include zinc phosphide ($Zn_3P_2$), zinc arsenide ($Zn_3As_2$), zinc antimonide ($Zn_3Sb_2$), cadmium phosphide ($Cd_3P_2$), cadmium arsenide ($Cd_3As_2$), cadmium antimonide ($Cd_3Sb_2$), combinations of these, and the like. Group IIB/VA semiconductors including a combination of Group JIB species and/or a combination of Group VA species (e.g., $Cd_xZn_yP_2$, wherein each x and y is independently about 0.001 to about 2.999 and x+y is 3) also may be used. In an illustrative embodiment, the Group IIB/VA semiconductor material comprises p-type and/or n-type $Zn_3P_2$. Optionally, other kinds of semiconductor materials also may be incorporated into the composition.

The pnictide compositions used in the practice of the present invention may be amorphous and/or crystalline as supplied or formed, but desirably are crystalline prior to carrying out the treatment according to the present invention. Crystalline embodiments may be single crystal or polycrystalline, although single crystal embodiments are preferred. Exemplary crystalline phases may be tetragonal, cubic, monoclinic, and the like. Tetragonal crystalline phases are more preferred, particularly for zinc phosphide.

Pnictide compositions having photovoltaic and/or semiconducting characteristics may be of n-type or p-type. Such materials may be intrinsically and/or extrinsically doped. In many embodiments, extrinsic dopants may be used in a manner effective to help establish a desired carrier density, such as a carrier density in the range from about $10^{13}$ $cm^{-3}$ to about $10^{20}$ $cm^{-3}$. A wide range of extrinsic dopants may be used. Examples of extrinsic dopants include Al, Ag, B, Mg, Cu, Au, Si, Sn, Ge, Cl, Br, S, Se, Te, N, I, In, Cd, F, H, combinations of these and the like.

Pnictide films in the practice of the present invention may have a wide range of thicknesses. Suitable thicknesses may depend on factors including the purpose of the film, the composition of the film, the methodology used to form the film, the crystallinity and morphology of the film, and/or the like. For photovoltaic applications, a film desirably has a thickness effective to capture incident light for photovoltaic performance. If the film were to be too thin, too much light may pass through the film without being absorbed. Layers that are too thick will provide photovoltaic functionality, but are wasteful in the sense of using more material than is needed for effective light capture and reduced fill factors due to increased series resistance. In many embodiments, pnictide films have a thickness in the range from about 10 nm to about 4 microns, or even from about 50 nm to about 1.5 microns. By way of example, a thin film having p-type characteristics that is used to form at least part of a p-n, p-i-n, Schottky junction, or the like, may have a thickness in the range from about 1 to about 5μm, preferably about 2 to about 3 μm. A thin film having n-type characteristics that is used to form at least part of a p-n, p-i-n, or the like, may have a thickness in the range from about 0.02 to about 2μm, preferably about 0.05 to about 0.2 μm.

Pnictide films may be formed from a single layer or multiple layers. Single layers may have a generally uniform composition throughout or may have a composition that shifts throughout the film. A layer in a multilayer stack typically has a different composition than adjacent layer(s), although the composition of nonadjacent layers may be the similar or different in such embodiments.

Pnictide films desirably are supported upon a suitable substrate. Exemplary substrates may be rigid or flexible, but desirably are flexible in those embodiments in which the resultant microelectronic device may be used in combination with non-flat surfaces. A substrate may have a single or multilayer construction. When the pnictide film is to be incorporated into an optoelectronic device, the substrate may include at least a portion of those layers that would be underneath the film in the finished device if the device is built right side up. Alternatively, the substrate may be at least a portion of the layers that would be above the film in the finished device if the device is being fabricated upside down.

The treatment of the present invention may be used to dramatically improve the surface quality of the pnictide film. Often, the pnictide film as provided has a number of quality issues that desirably are addressed in order to provide optoelectronic devices with better electronic performance. Quality issues include polishing damage, native oxide, adventitious carbon, other surface impurities, and the like. Quality issues such as these can lead to problems such as undue surface defect density, undue surface trap states, undue surface recombination velocity, and the like.

According to the treatment of the present invention, the pnictide film is contacted with a first etching composition in a manner effective to form a pnictogen-rich region on the surface of the film. As used herein, pnictogen-rich means that the region contains a greater atomic percentage of pnictogen(s) than the pnictide semiconductor film on which the region is formed. For example, $Zn_3P_2$ is a pnictide semiconductor that contains 40 atomic percent of phosphorous. A pnictogen-rich region formed on zinc phosphide would be one that has greater than 40 atomic weight percent of phosphorus and/or other pnictogens.

The excess amount of pnictogen in the pnictogen-rich region may be given by the formula $$[[\%P_R-\%P_F]/\%P_F]\times 100\%$$

wherein $\%P_R$ is the atomic percent of pnictogen in the pnictogen-rich region, and $\%P_F$ is the atomic percent of pnictogen(s) in the pnictide semiconductor film. Desirably, the excess amount of pnictogen according to this formula is at least 10%, preferably at least 30%, more preferably at least 75%.

The atomic percentage of pinctogen can be determined by any suitable technique. Exemplary techniques include depth profile techniques such as XPS depth profile techniques and secondary ion mass spectroscopy (SIMS). SIMS techniques are preferred. Desirably, analysis is carried out on three representative test samples or sample regions. The atomic percentage is taken as the average of the three samples.

Without wishing to be bound, it is believed that the pnictogen-rich region comprises molecular pnictogen in many embodiments. The term "molecular pnictogen" refers to molecules that are formed only from one or more pnictogens. In some instances, the pnictogen-rich region is essentially entirely all pnictogen and/or molecular pnictogen. For example, treatment of a zinc phosphide film using treatments of the present invention may yield a pnictogen-rich region that is substantially entirely phosphorous. In such instances, the atomic percentage of pnictogen in the region is 100%. The excess relative to the underlying zinc phosphide according to the above formula is 150%. Without wishing to be bound, it is believed that the pnictogen-rich region is at least partially amorphous in many embodiments, but may have some crystalline domains as well.

The resultant pnictogen-rich region may form with a thickness in a wide range. In many embodiments, the resultant pnictogen-rich region is a relatively thin layer having a thickness of about 20 nm or less, even 10 nm or less, or even 7 nm or less. In many embodiments, the resultant pnictogen-rich region is a relatively thin layer having a thickness of at least about 1 nm. Treatment of zinc phosphide films using principles of the present invention would form phosphorous layers having a thickness of 2 to 3 nm with strongly amorphous character in representative modes of practice.

In many embodiments, the treatment with the first etching composition also may etch and remove a portion of the pnictide semiconductor film. The etching treatment may also remove carbon, organic impurities, and other contaminants. If desired, mask(s) may be used to protect one or more portions of the pnictide semiconductor film surface from the first etching composition treatment stage(s) if desired. More desirably, particularly for those embodiments in which the pnictide film is to be a component of an optoelectronic device, it is more preferred that the treatment of the present invention be applied to the entirety of the pnictide film.

A wide range of etching compositions may be used singly or in combination as the first etching composition(s). Exemplary first etching compositions include an etching composition comprising a Br-containing ingredient in a solvent such as one or more alcohols such as methanol. Use of bromine/methanol is desirable as an etching composition, because treatment of zinc phosphide with this reagent forms a substantially amorphous phosphorous region on the zinc phosphide. Such an overlayer is relatively easy to remove in subsequent step(s). More than one etchng reagent can be used as the first etching composition. If more than one such first etching composition is used, these may be used together and/or sequentially. If used sequentially, the film surface may be rinsed between etching.

The first etching composition may be caused to contact the pnictide film surface in a variety of ways. Exemplary techniques include wet bench immersion, spray techniques, dry phase etching, plasma phase etching, ion milling, focused beam techniques, chemical etch combined with mechanical polish and combinations of these. Polishing, e.g., chemical and/or mechanical polishing, may be practiced on the pnictide film surface prior to treatment with the first etching composition.

In some embodiments, the coverage and thickness of the resultant pnictogen-rich region over the pnictide semiconductor film can be used to assess the appropriate duration of the etching treatment. For instance, in the illustrative case of a zinc phosphide film, etching can be carried out for a sufficient duration until a phosphorous region having a desired thickness such as a thickness in the range of from about 1 nm to about 20 nm is formed on the film surface. This assessment can be made in empirical testing and thereafter the etching duration that yielded this level of film modification could be incorporated into a standard recipe.

The first etching composition(s) can be used at one or more temperatures over a wide range. Generally, the first etching treatment occurs at a temperature greater than the freezing point and less than the boiling point of the etching compositions when wet etching techniques are used while avoiding extreme temperatures that could damage the film being treated or its. substrate. When dry etching techniques are used, extreme temperatures are avoided that could damage the pnictide film or the substrate. In exemplary embodiments, temperatures in the range from 15° C. to 200° C. would be suitable. Room temperature is desirable and convenient inasmuch as etching proceeds at a suitable rate at this temperature. If rate adjustments are desired, the bromine concentration in the first etch composition can be increased (faster etch rate) or reduced (slower etch rate) as desired. Bromine concentrations in the range from 0.5 to 10 volume percent in methanol would provide a suitable range for selecting a suitable etch rate in many modes of practice.

The first etching treatment desirably occurs in a protected environment to protect the pnictide film and its substrate from the ambient. In some embodiments, the protected environment may include an atmosphere of nitrogen, argon, carbon dioxide, clean dry air, combinations of these, and the like. The pressure may be at ambient pressure, a vacuum, or at a pressure above ambient pressure.

Treatment with the first etching composition may occur in a single treatment or in a series of two or more etching treatments. The film optionally may be rinsed with a suitable rinsing liquid (e.g., water and/or an alcohol) and/or dried between etches.

After the first stage of etching, the workpiece bearing the pnictide film may be immediately carried forward to the next stage of treatment. In many embodiments, however, the workpiece is rinsed and optionally dried prior to further treatment to avoid contaminating the next stage of treatment with the etching composition(s) used in the first stage of treatment.

The treatment of the present invention further comprises removing at least a portion of the pnictogen-rich region. More preferably, substantially the entirety of the pnictogen-rich region is removed to expose the surface of the underlying pnictide semiconductor film.

Removal of the pnictogen-rich region can be accomplished using a variety of technique(s) singly or in combination. In exemplary modes of practice, removal is accomplished using one or more etching compositions. Dry and/or wet etching techniques may be used. Desirably, removal is accomplished using an etching composition that is different from the first etching composition and that selectively removes the pnictogen-rich region or a derivative thereof (e.g., an oxidized form of the pnictogen-rich region is one example of a derivative) relative to the underlying pnictide semiconductor film. Desirably, the selectivity is at least 3:1, more desirably at least 10:1, even more desirably at least 20:1, and even more desirably at least 100:1. The selectivity is the etch rate of the pnictogen-rich region or derivative thereof relative to the underlying pnictide semiconductor film under the process conditions being used.

In an illustrative mode of pratice, removal of the pnictogen-rich region is accomplished by contacting the pnictogen-rich region with a second etching composition (which may be the same or different than the first etching composition) optionally in the presence of one or more oxidizing agents. In some embodiments, the second etching composition is a fluid admixture that contacts the workpiece to accomplish etching. The oxidizing agent(s) may be incorporated into the fluid admixture and/or may be present as a gas or vapor in the ambient.

In the presence of the oxidizing agent, it is believed that the pnictogen-rich region is progressively oxidized as etching progresses. Advantageously, the resultant pnictogen oxide relatively easily and selectively removed from the workpieces relative to the underlying, pnictide semiconductor material. Additionally, the selective removal occurs in a manner that leaves a high quality, smooth film surface for subsequent fabrication steps. For optoelectronic devices, particularly photovoltaic devices, a substantial portion, and more preferably all of the amorphous material should be removed. Even though the thickness of the pnictogen-rich region is quite thin, being on the order 50 nm or less, and even 10 nm or less, the presence of the region could seriously and adversely impact electronic performance if not sufficiently removed.

A wide variety of oxidizing agents may be used to accomplish oxidation of the pnictogen-rich region. Exemplary oxidizing agents including oxygen (such as the oxygen content included in clean dry air), a peroxide such as aqueous hydrogen peroxide, ozone, wet air, and nitrogen entrained with water and $CO_2$, combinations of these, and the like. Oxygen in clean dry air and/or aqueous hydrogen peroxide are more preferred, as these mild oxidizing agents are active enough to oxidize a pnictogen-rich, substantially amorphous material such as phosphorous but are mild enough to avoid unduly degrading the underlying pnictide semiconductor material.

The oxidizing agent(s) can be introduced at various time(s) during the course of the removal treatment of the present invention. In some embodiments, the oxidizing agent(s) are introduced as a separate treatment step between the first etching treatment stage described above and the removal treatment. In alternative embodiments, the oxidizing agent(s) are co-introduced with the etching composition(s) used in the removal treatment. In other embodiments, the oxidizing agent(s) are co-introduced with the etching composition(s) used in the first etching treatment stage described above. In still other embodiments, combinations of two or more of these introduction strategies are used.

The treatment step with the oxidizing agent generally occurs for a duration that is long enough for the desired portion, preferably all of the amorphous material to be converted to an oxide. However, if the treatment occurs for too long, an undue portion of the desired pnictide semiconductor material could be oxidized as well. In illustrative embodiments with respect to an amorphous phosphorous film having a thickness of about 2 to 3 nm that is being oxidized with aqueous hydrogen peroxide (0.25 wt % concentration) and being co-introduced in a second etching treatment stage at a temperature of 25° C., a treatment duration of about 30 seconds to about two minutes would be suitable.

The removal of the pnictogen-rich region desirably involves using a second etching composition optional occurring after and/or in the presence of one or more oxidizing agents. A wide range of etching compositions may be used singly or in combination as the second etching compositions. The second etching composition(s) may be the same or different than the one(s) uses as the first etching composition(s) but in many embodiments are different as being milder in terms of etching action. More preferred, milder, exemplary etching compositions suitable for use as the second etching compositions include aqueous HF (e.g., solutions in which the HF concentration is on the order of about 20 weight percent or less, preferably about 10 weight percent or less, or even 1 weight percent or less), buffered HF, combinations of these, and the like. If more than one etching composition is used, these may be used together and/or sequentially. If used sequentially, the workpiece may be rinsed between the etching treatments.

A preferred second etching composition comprises aqueous HF. Aqueous HF has excellent selectivity for removing pnictogen oxide relative to the desired, underling pnictide.

The second etching composition can be caused to contact the workpiece in a variety of ways. Exemplary techniques include wet bench immersion, spray techniques, dry phase etching, plasma phase etching, mechanical etching, reverse electroplating, combinations of these, and the like.

Etching with the second etching composition is carried out for a time period long enough to remove the desired portion, preferably the entirety of, the pnictogen-rich region or derivative thereof that is present so as to provide a high quality surface on the pnictide semiconductor film for promoting electronic performance of resulting optoelectronic devices. If the second etching composition(s) and oxidizing agent(s) are co-introduced, it may be desirable that the second etching composition(s) are introduced for an additional time period after co-introduction of oxidizing agent(s) is stopped. This helps to ensure that the resultant etched surface desirably is free of amorphous material for better electronic performance.

The second etching treatment to remove the pnictogen oxide(s) can occur at one or more temperatures over a wide range. Generally, the second etching treatment occurs at a temperature greater than the freezing point and less than the boiling point of the etching composition when wet etching compositions are used while avoiding temperatures that could damage the film being treated or its substrate. When dry etching techniques are used, temperatures are avoided that could damage the film or the substrate. In exemplary embodiments, temperatures in the range from 15° C. to 300° C. would be suitable.

The second etching stage may occur in a single treatment or in a series of two or more etching treatments. The film optionally may be rinsed with a suitable rinsing liquid (e.g., water and/or an alcohol) and/or dried between etches.

Etching desirably occurs in a protected environment to protect the film and its substrate from the ambient. In some embodiments, the protected environment may include an atmosphere of nitrogen, argon, carbon dioxide, clean dry air, combinations of these, and the like. The pressure may be at ambient pressure, a vacuum, or at a pressure above ambient pressure.

After the treatment of the present invention is practiced, the surface quality of the pnictide film is greatly improved. Incorporating the improved pnictide film into optoelectronic devices, particularly photovoltaic devices, provides many advantages. The treatment yields smooth surfaces that are well-prepared for further fabrication steps. The surfaces have reduced surface defect density and/or surface recombination rate characteristics. The method is suitable for bench top or commercial scale, offering the potential for high through-put and low cost. The method advantageously can be carried out at ambient temperature. For samples that contain Mg:$Zn_3P_2$, the approach avoids undue formation of MgO. Additionally, the undue formation of one or more surface materials such as ZnO and zinc phosphate compounds ($Zn_3(PO_4)_2$, $Zn_3(PO_4)$(OH), $Zn_3(PO_4)_2 \cdot 4H_2O$, etc.) is substantially reduced and even avoided by this process.

The methods of the present invention may be used in combination with other strategies to achieve further improvements in device performance. For example, after performing the treatment of the present invention, the properties of the pnictide film can be further enhanced using the metallization/annealing/alloying/removal techniques described in Assignee's co-pending U.S. Provisional Patent Application filed on the same date as the present application in the names of Kimball et al., titled METHOD OF MAKING PHOTOVOLTAIC DEVICES INCORPORATING IMPROVED PNICTIDE SEMICONDUCTOR FILMS USING METALLIZATION/ANNEALING/REMOVAL TECHNIQUES, and having Ser. No. 61/592,950, the entirety of which is incorporated herein by reference for all purposes. This treatment removes impurities and results in a highly passivated surface with reduced electronic defects. As another option, the pnictide film of the present invention can be a p-type semiconductor film that is incorporated into a p-n heterojunction, wherein the n-type material is formed using metal-tuning techniques described in Assignee's co-pending U.S. Provisional Patent Application in the names of Boscoe et al., titled METHOD OF MAKING PHOTOVOLTAIC DEVICES WITH REDUCED CONDUCTION BAND OFFSET BETWEEN PNICTIDE ABSORBER FILMS AND EMITTER FILMS., and having Ser. No. 61/592,957, the entirety of which is incorporated herein by reference for all purposes.

FIG. 1 shows how a pnictide film of the present invention may be incorporated into an illustrative photovoltaic device 50. FIG. 1 schematically illustrates a photovoltaic device 50 incorporating a pnictide semiconductor film 52 that has been treated in accordance with the methodology of the present invention. For purposes of illustration, film 52 has p-type characteristics and functions as an absorber region. Film 52 is supported upon substrate 54. Optional pnictide alloy layer 56 is provided on film 52. Without wishing to be bound, it is possible that the alloy layer 56 may function as an "I" layer in the resultant photovoltaic junction. If so, the resulting junction would be a p-i-n junction. An n-type emitter layer 58 is provided over the alloy layer 56. Window layer 60 is provided over the emitter layer 58. Transparent electrode layer 62 is formed over window layer 60. Collection grid 64 is formed over layer 62. One or more environmental protection barriers (not shown) can be used to protect device 50 from the ambient.

The present invention will now be further described with reference to following illustrative examples.

EXAMPLE 1

Bulk $Zn_3P_2$ Wafer Preparation and Surface Etching

The $Zn_3P_2$ substrates used in this study were grown by a physical vapor transport process. Red phosphorus chips and zinc shot (99.9999%, Alfa Aesar) were combined at 850° C. to form $Zn_3P_2$ powders that were then grown into polycrystalline boules 1 cm in diameter, 4 cm in length, and with 1-5 $mm^2$ grain size. See A. Catalano, Journal of Crystal Growth 49 (4), 681-686 (1980); F. C. Wang, R. H. Bube, R. S. Feigelson and R. K. Route, Journal of Crystal Growth 55 (2), 268-272 (1981); G. M. Kimball, N. S. Lewis, H. A. Atwater and Ieee, in Pvsc: 2008 33rd Ieee Photovoltaic Specialists Conference, Vols 1-4 (2008), pp. 150-155. The resulting crystals were diced with a diamond saw and lapped with diamond abrasive films to produce $Zn_3P_2$ wafers with root-mean-square surface (RMS) roughness of 2 nm to 3 nm as measured by atomic force microscopy. Hall effect measurements on the p-type, intrinsically-doped $Zn_3P_2$ samples yielded a hole density of about $10^{15}$ $cm^{-3}$ and hole mobility of 18 $cm^2$ $V^{-1}$ $s^{-1}$. Samples hereafter referred to as "Br-etched" were immersed for 30 s in 2-3% (v:v) $Br_2$ in $CH_3OH$, rinsed in $CH_3OH$, and dried under a stream of $N_2(g)$. Etching in 2% $Br_2$ in $CH_3OH$ was measured to have a bulk etch rate of ~30 nm $s^{-1}$ and resulting in substrates with 1.3 nm RMS roughness. Samples referred to as "HF-treated" were stirred rapidly in 10% HF-0.25% $H_2O_2$ (v:v) (aq) for 60 s, rinsed in water, and dried under a stream of $N_2$(g).

EXAMPLE 2

X-ray Photoelectron Spectroscopy Characterization of Etched $Zn_3P_2$ Surfaces Surface chemical composition of $Zn_3P_2$ substrates was monitored by XPS using a Kratos surface science instrument with monochromated x-rays of 1486.7 eV, detection linewidth of 0.35 eV, and photoelectrons collection at 0° from the surface normal. H. W. Nesbitt, G. M. Bancroft, R. Davidson, N. S. McIntyre and A. R. Pratt, American Mineralogist 89 (5-6), 878-882 (2004). High resolution XP spectra were processed using linear baseline subtraction, with the Zn $2p^{3/2}$ region using 9:1 Gaussian-Lorentzian product functions and the P 2p region using pure Lorentzian product functions, a doublet area ratio constrained to 2:1, and a doublet separation constrained to 0.877 eV. M. Taniguchi, S. Suga, M. Seki, H. Sakamoto, H. Kanzaki, Y. Akahama, S. Endo, S. Terada and S. Narita, Solid State Communications 49 (9), 867-870 (1984). Chemical overlayer coverages were calculated by the method of Seah and Dench. M. P. Seah, in *Practical Surface Analysis*, edited by D. Briggs and M. P. Seah (John Wiley & Sons, Chichester, 1990), Vol. 2nd ed., pp. 201-255.

Figure 2:
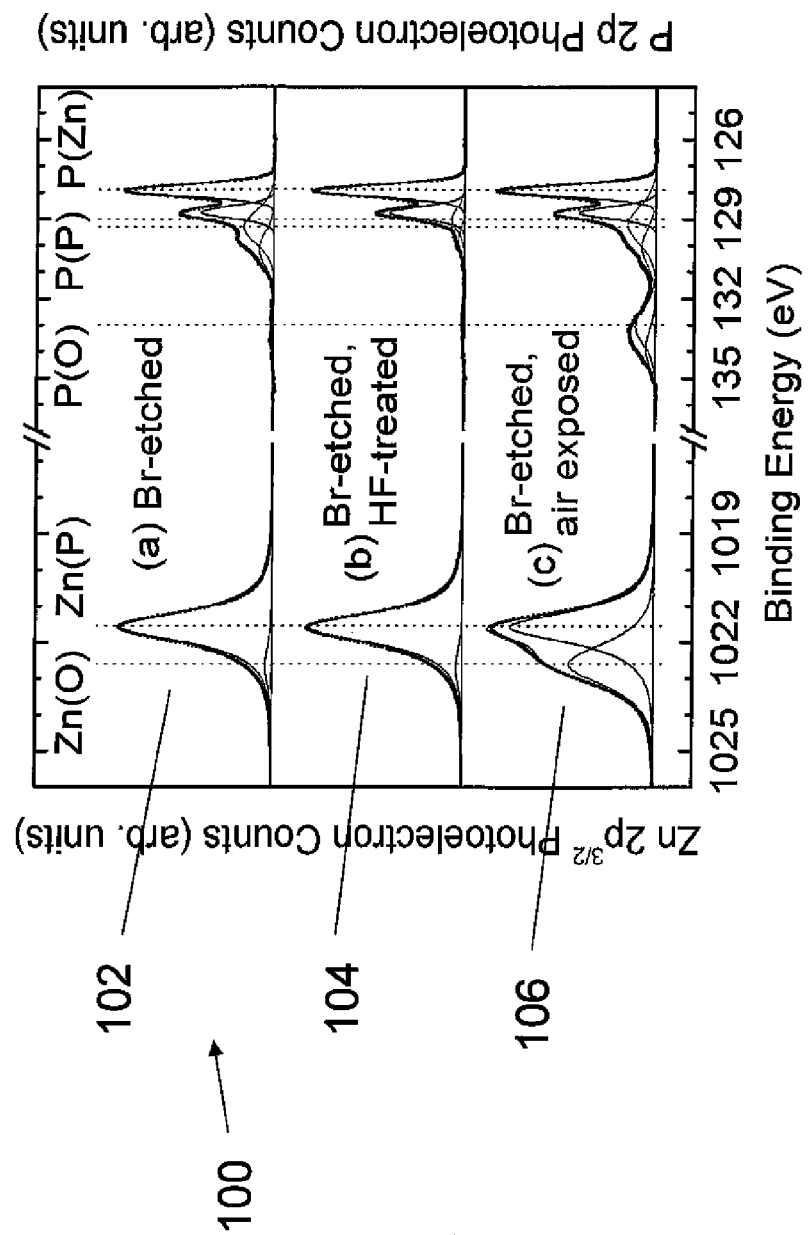
FIGS. 2(a), (b), and (c) show high-resolution XPS analyses of the Zn $2p^{3/2}$ and P 2p of chemically treated $Zn_3P_2$ substrates.

FIG. 2(a)-(c) show high-resolution XPS analysis of the Zn $2p^{3/2}$ and P 2p of chemically treated $Zn_3P_2$ substrates. After etching with 2% $Br_2$ in $CH_3OH$ for 30 s, the substrates exhibited bulk stoichiometric Zn and P species, submonolayer zinc and phosphorus oxidation, and 4.1±0.5 monolayers of contamination by elemental phosphorus ($P^0$) (FIG. 2a). Further treatment of the Br-etched substrates with 10% HF-0.25% $H_2O$ (aq) for 60 s selectively decreased the $P^0$ surface coverage to 1.4±0.2 monolayers without introducing additional surface oxidation of Zn or P species (FIG. 2b). In no case was residual bromine or fluorine observed from the chemical treatments and carbon contamination was observed to be submonolayer. High-resolution XP spectra of substrates that had been etched with 2% $Br_2$ in $CH_3OH$ for 30 s and then exposed to air for one week (FIG. 2c) showed oxidized phosphorus and oxidized zinc signals that were consistent with the presence of 4±2 monolayers of $Zn_x(PO_3)_y$ species. Table 1 shows the binding energies and Gaussian widths observed for surface zinc and phosphorus species for the series of $Zn_3P_2$ surface preparations:

TABLE I

XPS binding energies for Zn $2p_{3/2}$ and P $2p_{3/2}$ species including bulk $Zn_3P_2$, residual elemental phosphorus, and native oxidation

| core level | species | Binding energy (eV) | Gaussian width (eV) |
|---|---|---|---|
| Zn $2p_{3/2}$ | $Zn_3P_2$ | 1021.6 ± 0.1 | 0.96 ± 0.02 |
| Zn $2p_{3/2}$ | $ZnO_x$ | 1022.6 ± 0.1 | 1.4 ± 0.1 |
| P $2p_{3/2}$ | $Zn_3P_2$ | 127.9 ± 0.1 | 0.54 ± 0.02 |
| P $2p_{3/2}$ | $P^0$ | 129.1 ± 0.2 | 1.3 ± 0.2 |
| P $2p_{3/2}$ | $PO_x$ | 133.0 ± 0.3 | 1.5 ± 0.1 |

EXAMPLE 3

Steady State and Time-resolved Photoluminescence Measurements on Etched Zn3P2 Surfaces Steady-state PL measurements were performed on each of the etched $Zn_3P_2$ surfaces using the 488 nm line of an Ar-ion laser that was chopped at 10 kHz using an acousto-optic modulator. The emission passed through a monochromator to an infrared photomultiplier tube and a lock-in amplifier monitored the PL signal. Steady-state PL was collected under ambient conditions and using a laser power of <10 mW $cm^{-2}$. Time-resolved PL measurements were performed at 10 Hz with 70 ps, 355 nm, 10 μJ pulses produced by frequency-tripling of regeneratively amplified, mode-locked Nd:YAG laser pulses. A fiber optic collected the emission and a streak camera integrated the PL signal. Analysis of the time-resolved PL data was performed by numerically solving the continuity equations under the assumption of high-level injection. S. W. Feldberg, M. Evenor, D. Huppert and S. Gottesfeld, Journal of Electroanalytical Chemistry 185 (2), 209-228 (1985); D. Huppert, M. Evenor and Y. Shapira, Journal of Vacuum Science & Technology a-Vacuum Surfaces and Films 2 (2), 532-533 (1984). With fixed assumptions for bulk nonradiative lifetime of 20 ns and ambipolar diffusion coefficient of 1 $cm^2$ $s^{-1}$, the only adjustable parameter was the surface recombination velocity (SRV), which was varied from $10^3$ to $10^7$ cm $s^{-1}$ in the simulation. G. M. Kimball, A. M. Muller, N. S. Lewis and H. A. Atwater, Applied Physics Letters 95 (11), 3 (2009); M. Bhushan, Journal of Applied Physics 53 (1), 514-519 (1982); S. M. Sze and K. K. Ng, *Physics of Semiconductor Devices*, 3rd ed. (Wiley-Interscience, 2006). S. W. Feldberg, M. Evenor, D. Huppert and S. Gottesfeld, Journal of Electroanalytical Chemistry 185 (2), 209-228 (1985). The high intensity of the laser pulses used for time-resolved PL are sufficient to reach the flat band condition with peak excess carrier densities of ~$10^{18}$ $cm^{-3}$. S. W. Feldberg, M. Evenor, D. Huppert and S. Gottesfeld, Journal of Electroanalytical Chemistry 185 (2), 209-228 (1985).

Figure 3:
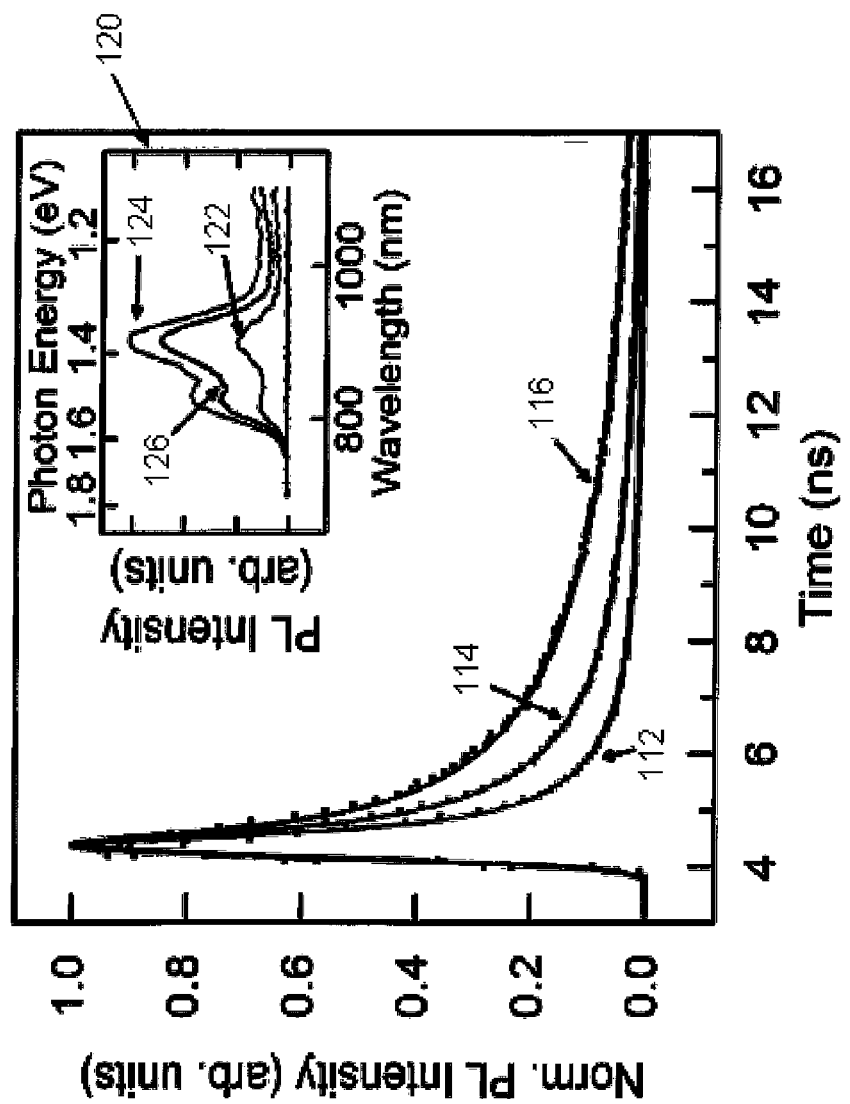
FIG. 3 shows time-resolved PL decay traces and steady-state PL spectra for chemically treated $Zn_3P_2$ substrates.

FIG. 3 shows time-resolved PL decay traces and steady-state PL spectra for chemically treated $Zn_3P_2$ substrates. Under high-level injection, the PL decay dynamics immediately after the laser pulse are dominated by the effects of surface recombination and quantitative estimates of surface recombination velocity values were extracted as shown in the following Table 2:

TABLE II

Results of photoluminescence-based characterization of chemically treated $Zn_3P_2$, where relative PL intensity was recorded at 890 nm, and time-resolved PL decays were used to determine surface recombination velocity. (S), and surface trap density ($N_t$) was derived using the relationship $S = N_t \sigma v_{th}$ (assuming carrier capture cross section $a = 10^{-16}$ $cm^2$ and thermal velocity of carriers $v_{th} = 10^7$ cm $s^{-1}$)

| sample | relative PL signal (arb. units) | S (cm $s^{-1}$) | $N_t$ ($cm^{-2}$) |
|---|---|---|---|
| polished | < 0.02 | n/a | n/a |
| (i) | 1.0 ± 0.2 | 2.8 ± 0.1 × $10^4$ | 3 × $10^{13}$ |
| (ii) | 2.3 ± 0.2 | 1.0 ± 0.1 × $10^4$ | 1 × $10^{13}$ |
| (i), 1 week air | 1.7 ± 0.2 | 1.8 ± 0.1 × $10^3$ | 2 × $10^{12}$ |

(i) = 2% (v:v) $Br_2$ in $CH_3OH$ for 30 s.
(ii) = (i) + 10% HF, 0.25% $H_2O_2$ (aq) for 60 s.

PL from freshly polished samples was not detectable in either time-resolved or steady-state PL measurements (black line, inset FIG. 3). However, etching with 2% $Br_2$ in $CH_3OH$ for 30 s removed the zinc-rich surface oxide surface layer and/or subsurface mechanical damage to yield substrates with readily observable PL. Br-etched samples that were stirred rapidly in 10% HF-0.25% $H_2O_2$ (aq) for 60 s showed an increase in steady-state PL intensity by a factor of 2.3±0.2 and a reduction in SRV values from 2.8±0.1×$10^4$ cm $s^{-1}$ to 1.0±0.1×$10^4$ cm $s^{-1}$. Br-etched $Zn_3P_2$ samples that were exposed to air for one week showed even longer PL decays than samples tested immediately after chemical treatment, with SRV values of $1.8\pm0.1\times10^3$ cm s$^{-1}$. Despite the improved recombination rate of Br-etched $Zn_3P_2$ samples that were exposed to air, the observation of lower steady-state PL intensity under low-level injection can be explained by an increase in surface band-bending. R. R. Chang, R. Iyer and D. L. Lile, Journal of Applied Physics 61 (5), 1995-2004 (1987); E. Yablonovitch, B. J. Skromme, R. Bhat, J. P. Harbison and T. J. Gmitter, Applied Physics Letters 54 (6), 555-557 (1989). Assuming similar cross sections for carrier capture, the formation of native oxides on Br-etched $Zn_3P_2$ samples thus corresponded to the passivation of >90% of the active surface recombination sites.

EXAMPLE 4

Impedance Measurements on Etched Zn3P2 Surfaces with deposited Al2O3

Impedance measurements of $Hg/Al_2O_3/Zn_3P_2$ devices were performed using Hg-drop electrodes and ~60 nm insulating layers of $Al_2O_3$ deposited by electron-beam evaporation. The devices were swept from accumulation to depletion at 80 mV s$^{-1}$ and capacitance was monitored at 10 kHz with a 10 mV alternating potential. Surface state density distributions were estimated using the high-frequency capacitance method first developed by Terman. S. M. Sze and K. K. Ng, Physics of Semiconductor Devices, 3rd ed, (Wiley-Interscience, 2006); L. M. Terman, Solid-State Electronics 5 (SEP-O), 285-299 (1962). Using values of $\epsilon_{Al2P3}=4.5$, $\epsilon_{Zn3P2}=11$ and dopant density of $10^{15}$ cm$^{-3}$, the measured capacitance was used to compute the capacitance of the depletion region and the surface potential as functions of gate bias. S. M. Sze and K. K. Ng, *Physics of Semiconductor Devices*, 3rd ed. (Wiley-Interscience, 2006); J. Misiewicz, J. M. Wrobel and B. P. Clayman, Solid State Communications 66 (7), 747-750 (1988).

Figure 4:
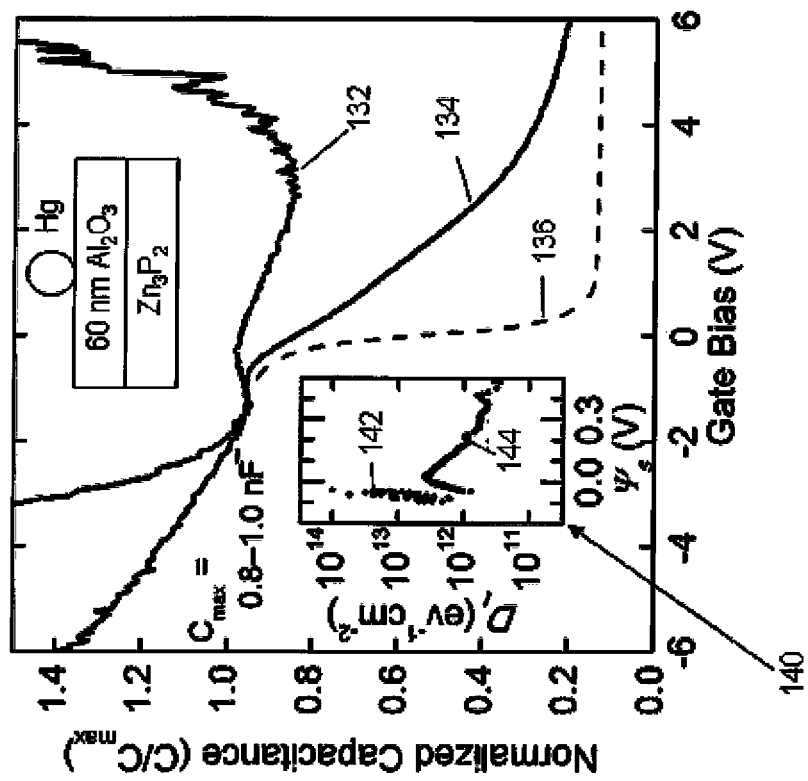
FIG. 4 compares nolinalized capacitance data collected from $Hg/Al_2O_3/Zn_3P_2$ devices to the expected ideal performance in the absence of surface trap states.

FIG. 4 compares normalized capacitance data collected from $Hg/Al_2O_3/Zn_3P_2$ devices to the expected ideal performance in the absence of surface trap states. Ideal MIS devices with p-type semiconductors show decreasing capacitance with increasing positive gate bias as the semiconductor is swept into depletion. Freshly Br-etched $Zn_3P_2$ substrates, however, showed only small modulation of capacitance with gate bias that was consistent with a high density of surface defects of $>10^{13}$ eV$^{-1}$ cm$^{-2}$. The capacitance data from Br-etched $Zn_3 P_2$ substrates that had been exposed to air for one week showed significant depletion of the semiconductor with positive gate bias and allowed for an estimate of $D_t$, the surface trap density distribution of $~10^{12}$ eV$^{-1}$ cm$^{-2}$ (FIG. 4 inset). The surface trap density distributions derived from capacitance measurements of MIS devices were consistent with the surface trap density values derived from time-resolved PL measurements.

Other embodiments of this invention will be apparent to those skilled in the art upon consideration of this specification or from practice of the invention disclosed herein. Various omissions, modifications, and changes to the principles and embodiments described herein may be made by one skilled in the art without departing from the true scope and spirit of the invention which is indicated by the following claims.

What is claimed is:

1. A method of making a photovoltaic device, comprising the steps of:
   a. providing a pnictide semiconductor film comprising at least one pnictide semiconductor comprising zinc and phosphorous, said film having a surface;
   b. treating the film, said treating comprising the steps of:
      i. contacting the film with a first etching composition in a manner effective to form a phosphorus-rich region on the surface of the film; and
      ii. in the presence of an oxidizing agent, removing at least a portion of the phosphorus-rich region using a second etching composition that selectively etches the phosphorus-rich region or a derivative thereof relative to the pnictide semiconductor film.

2. The method of claim 1, wherein the removing step removes a derivative of the phosphorus-rich region, said derivative comprising an oxide of a pnictogen.

3. The method of claim 1, wherein the phosphorus-rich region is at least partially amorphous.

4. The method of claim 1, further comprising the step of incorporating the pnictide film into a photovoltaic device.

5. The method of claim 1, wherein the first and second etching compositions are different.

6. The method of claim 1, wherein the second etching composition is a fluid admixture that comprises at least one oxidizing agent.

7. The method of claim 6, wherein the second etching composition is aqueous and the oxidizing agent comprises aqueous hydrogen peroxide.

8. The method of claim 1, wherein the second etching composition is caused to contact the phosphorus-rich region in an environment containing an oxidizing agent in a gas or vapor phase.

9. The method of claim 1, wherein the second etching composition comprises a fluorine-containing species.

10. The method of claim 1, wherein the first etching composition comprises a species comprising bromine.

11. The method of claim 1, wherein the second etching composition is aqueous and comprises aqueous HF.

12. The method of claim 1, wherein the first etching composition comprises a species comprising bromine and at least one alcohol.

13. The method of claim 12, wherein the alcohol comprises methanol.

14. The method of claim 1, wherein the second etching composition is aqueous and comprises a peroxide.

15. The method of claim 1, wherein step (a) further comprises incorporating Mg into at least a portion of the pnictide semiconductor film, wherein the magnesium is proximal to a surface portion of the pnictide semiconductor film.

* * * * *